United States Patent

Takahashi et al.

Patent Number: 6,061,283
Date of Patent: May 9, 2000

[54] SEMICONDUCTOR INTEGRATED CIRCUIT EVALUATION SYSTEM

[75] Inventors: Koji Takahashi; Hiroaki Yamoto; Hidenobu Matsumura, all of Santa Clara, Calif.

[73] Assignee: Advantest Corp., Tokyo, Japan

[21] Appl. No.: 09/178,462

[22] Filed: Oct. 23, 1998

[51] Int. Cl.$^7$ ........................................... G11C 7/00
[52] U.S. Cl. ............ 365/201; 365/189.07; 371/27.1; 371/274
[58] Field of Search .................. 365/201, 189.07, 365/189.08; 371/27.1, 274

[56] References Cited

U.S. PATENT DOCUMENTS

| | | | |
|---|---|---|---|
| 5,140,686 | 8/1992 | Cox et al. | 364/470 |
| 5,202,889 | 4/1993 | Aharon et al. | 371/27 |
| 5,815,513 | 9/1998 | Hiraide | 371/27.4 |

*Primary Examiner*—David Nelms
*Assistant Examiner*—Hien Nguyen
*Attorney, Agent, or Firm*—Muramatsu & Associat

[57] ABSTRACT

A semiconductor integrated circuit evaluation system for evaluating, at high speed, functions of a device under test and a test pattern for testing the device under test without using an actual tester or designed device. The evaluation system includes a test pattern file for storing a test pattern to be applied to a device for testing the device under test, a first memory for storing tester event information by receiving a predetermined amount of test pattern from the test pattern file, a first FIFO (first-in-first-out) for receiving a predetermined amount of the tester event information from the first memory and extracting the tester event information in the order of receiving the same, a second memory for storing device event information by receiving a predetermined amount of event information resulted from logic simulation of the device under test based on design data of the device produced through a computer aided design process, a second FIFO for receiving a predetermined amount of the device event information from the second memory and extracting the device event information in the order of receiving the same, a comparator for comparing the event information from the first FIFO and the second FIFO, and means for generating a comparison result from the comparator.

9 Claims, 8 Drawing Sheets

SEMICONDUCTOR INTEGRATED CIRCUIT EVALUATION SYSTEM

FIELD OF THE INVENTION

This invention relates to a system for evaluating semiconductor integrated circuits such as a large scale integrated circuit (LSI), and more particularly, to a semiconductor integrated circuit evaluation system for evaluating, at high speed, a test pattern produced for testing a semiconductor test system or performing a diagnostic test on the design of the semiconductor integrated circuit, based on logic simulation data produced in a design stage of the semiconductor integrated circuit through a CAD (computer aided design) process, without using an actual semiconductor test system or an actual semiconductor integrated circuit to be tested.

BACKGROUND OF THE INVENTION

In a process of developing semiconductor integrated circuits such as a large scale integrated circuit (LSI), almost always, a design method using a computer aided design (CAD) tool is employed. Such a design environment using a CAD tool is also refereed to as an electronic design automation (EDA) environment. In such a semiconductor development process incorporating the CAD tool, desired semiconductor circuits are created in an LSI with the use of a hardware description language such as VHDL and Verilog. Also in this process, functions of the semiconductor circuits thus designed are evaluated through a software simulator called a device logic simulator.

A device logic simulator includes an interface commonly called a testbench through which test data (vector) is applied to the design data showing the intended semiconductor circuits, thereby evaluating the response of the intended semiconductor circuits resulted from the test data.

After the design stage of the LSI circuit, actual LSI devices are produced and are tested by a semiconductor test system, such as an LSI tester, to determine whether the LSI devices properly perform the intended functions. An LSI tester supplies a test pattern (test vector) to an LSI device under test and compares the resultant outputs of the LSI device with expected data to determine pass/fail of the LSI device. For testing an LSI device with higher levels of functionality and density, a test pattern to be applied to the LSI device must accordingly be complex and lengthy, resulting in significantly large work load and work hours in producing the test patterns. Therefore, it is not preferable to produce the test patterns when an LSI device under test is actually produced, especially as to LSI devices of shorter life cycles, because it causes a time delay to put the LSI devices into market.

Thus, to improve an overall test efficiency and productivity of the semiconductor integrated circuits, it is a common practice to apply the data produced through the operation of the device logic simulator in the design stage of the integrated circuits to an actual test of the semiconductor integrated circuits. In general, a test procedure performed by an LSI tester in testing a semiconductor integrated circuit has a substantial similarity to the test procedure by the device logic simulator in the CAD process noted above for testing the design data of the semiconductor circuit. For example, test patterns and expected value patterns for an LSI tester to test the intended semiconductor integrated circuits are produced by utilizing the resultant data (dump file) produced by executing the device logic simulation. However, as of today, there is no system which is able to produce test patterns and expected data patterns to be used in an LSI tester and to evaluate the same, with high speed and low cost but without information errors, based on the dump file derived from the logic simulation of the LSI devices.

In such logic simulation data, test patterns to be applied to a device model as well as the resultant outputs (expected value patterns) of the device model are expressed by an event base. Here, the event base data expresses the points of change (events) in a test pattern from logic "1" to logic "0" or vice versa with reference to the passage of time. Generally, such time passage is expressed by a time length from a predetermined reference point or a time length from a previous event. In contrast, in an actual LSI tester, test patterns are described by a cycle base. In the cycle base data, test patterns are defined relative to predetermined test cycles (tester rates) of the tester.

As in the foregoing, test patterns for testing LSI devices actually produced are efficiently created by using the CAD data produced in the design stage of the LSI devices. However, because of various reasons, test patterns produced for an LSI tester in this manner may not always be appropriate to accurately detect failures of the LSI device under test. Thus, it is necessary to evaluate the test patterns produced through the foregoing procedure.

In the conventional technology, in evaluating the test patterns to be used in an LSI tester created with the use of the logic simulation data, there are basically two methods, one that uses an actual LSI tester and the other that does not use an LSI tester. In the method of using an actual LSI tester, it is necessary to extract event base test patterns in the logic simulation data and convert the same to cycle base test patterns. Such test patterns in the cycle base is run in the actual LSI tester to evaluate the correctness of the test patterns. This method is disadvantageous in that an expensive LSI tester is used only for evaluating an integrity of the test patterns.

In the method of not using an LSI tester, an LSI tester simulator is used for evaluating the test patterns. In this method as well, the LSI tester simulator debugs the test patterns that have been converted to the cycle base. For simulating the functions of the LSI device under test which receives the test pattern from the LSI tester simulator, a logic simulator is used which is created during the design process using the CAD tool. Since all of the evaluation process is performed through software processes, this method is disadvantageous in that it requires a very long time to finish the evaluation.

An example of the conventional technology without using the actual LSI tester is described in more detail below. FIG. 1 is an example of conventional technology for evaluating test patterns with the use of a tester simulator and a logic simulator, i.e., an example in which all of the operations are performed by software.

In FIG. 1, an LSI simulator 11 formed of software is provided with pattern data and timing data created for an LSI tester from a pattern file $10_1$ and a timing file $10_2$. The pattern data and the timing data are created, for example, by extracting pattern data and timing data from a dump file 15 resulted in performing a logic simulation in the design stage of the LSI device. An example of the logic simulator dump file is VCD (Value Change Dump) of Verilog. The data in the dump file 15 is converted to cycle base data by a conversion software 17, resulting in the pattern data and timing data noted above stored in the pattern file $10_1$ and the timing file $10_2$, respectively.

The LSI tester simulator 11 is to debug the test patterns to test the intended LSI device or the function of the LSI device without using an LSI tester hardware. The LSI tester simulator 11 generates a test pattern having pattern information and timing information and applies the test pattern to the logic simulator of the LSI device to be tested. The LSI tester simulator 11 compares the resultant output signals from the logic simulator with the expected data to determine the correctness of the test pattern or performances of the intended LSI device.

The LSI tester simulator 11 provides the test pattern to a format converter 12 as input data. The format converter 12 converts the input data from the LSI tester simulator 11 to a format to be accepted by a device logic simulator 13. Generally, the device logic simulator 13 includes an interface called PLI (Programming Language Interface). Thus, in such a case, the format converter 12 converts the test pattern to the PLI format.

The device logic simulator 13 is the simulator that has been used in the design stage of the LSI device and is formed of a logic simulator $13_1$ and a device model $13_2$ described in a language which is able to communicate with the logic simulator $13_1$. The device model $13_2$ simulates the operation of the LSI device to be tested. The device logic simulator 13 sends the test pattern received through the PLI interface to the device model $13_2$ and provides the resultant response from the device model $13_2$ to a format converter 14 through the PLI interface. The format converter 14 converts the output of the device model $13_2$ to a format to be received by the LSI tester simulator 11. The LSI tester simulator 11 compares the device output data from the format converter 14 with the expected value data. When both data mach, it is considered that the test pattern is correct.

In evaluating the test pattern solely by the software process using the device logic simulator as in the foregoing, it requires a large amount of work and a very long processing time. The time required for operating the device logic simulator accounts for the most part of the overall processing time.

SUMMARY OF THE INVENTION

Therefore, it is an object of the present invention to provide a semiconductor integrated circuit evaluation system for evaluating, at high speed, performances of an LSI device designed through an electronic design automation (EDA) process and test patterns for testing the LSI device in which the test patterns are produced based on the CAD data developed in the design stage of the LSI device.

It is another object of the present invention to provide a semiconductor integrated circuit evaluation system for evaluating, at high speed, without using an actual LSI tester, a test pattern for testing the LSI device, which is produced based on the CAD data developed in the design stage of the LSI device, to make it possible that the test pattern for testing the LSI device is completed before the LSI device is actually produced.

It is a further object of the present invention to provide a semiconductor integrated circuit evaluation system for evaluating, at high speed, a test pattern for testing an LSI device which is produced based on the CAD data developed in the design stage of the LSI device, with use of a small sized and dedicated hardware.

It is a further object of the present invention to provide a semiconductor integrated circuit evaluation system, which has an accelerator formed of a small sized and dedicated hardware and a work station having graphic display and logic simulation functions, for evaluating a test pattern for testing an LSI device which is produced based on CAD data developed in the design stage of the LSI device.

In the semiconductor integrated circuit evaluation system of the present invention, the function of the LSI device designed through an electric design automation (EDA) process is tested on a computer using a device logic simulator. Event data derived from executing the device logic simulation is stored in a dump file. A test pattern to be used in an LSI tester is produced by using pattern data and timing data converted from the data in the dump file. The waveform of an output pin of the test pattern is compared with the waveform of an output pin produced by the dump file in a predetermined timing relationship. Instead of the waveform produced by the dump file, it is also possible to use the output waveform of the logic simulator to compare the same with the test pattern. If both output waveforms match with one another, it is determined that the test pattern is appropriate or the intended device function is satisfied.

According to the semiconductor integrated circuit evaluation system of the present invention, a test pattern for testing an LSI device designed through an electric design automation (EDA) process is evaluated at high speed and low cost based on the design data produced in the design stage of the LSI device. In the test pattern evaluation system, the test pattern is evaluated by a small size hardware dedicated to the system, and the test pattern is evaluated with high speed and low cost, so that the test pattern and the performances of the LSI device are tested before the actual production of the LSI device.

DETAILED DESCRIPTION OF THE PREFERRED EMBODIMENT

Figure 1:
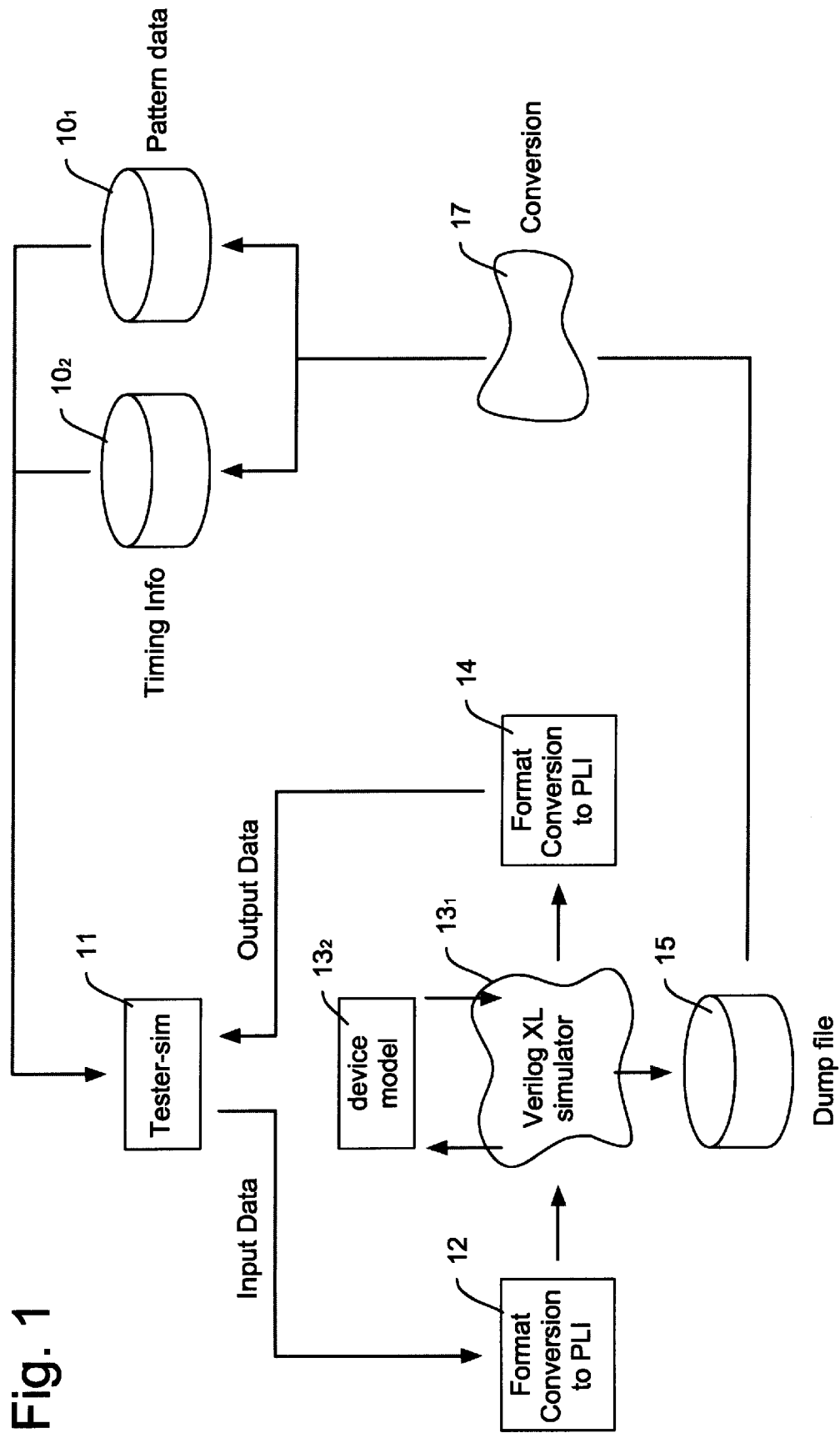
FIG. 1 is a schematic diagram showing a test pattern evaluation method in the conventional technology using a device logic simulator which is formed of software.
Figure 2A:
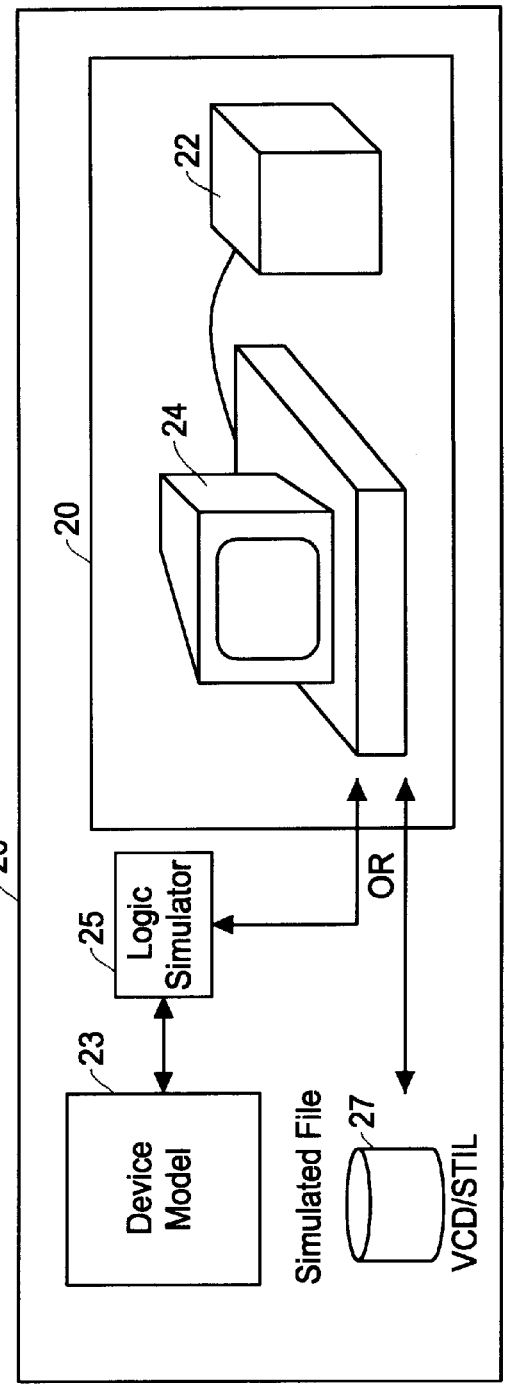
FIG. 2A is a block diagram showing a basic structure of the semiconductor integrated circuit evaluation system of the present invention.
Figure 2B:
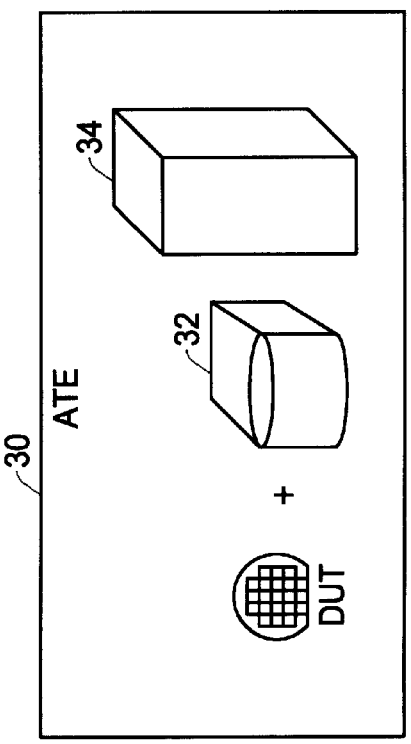
FIG. 2B is a schematic diagram showing an LSI tester having an equivalent function of the evaluation system of FIG. 2A.

The embodiment of the present invention is explained with reference to the drawings. FIG. 2A is a block diagram showing a basic structure of an inspection system 26 incorporating the semiconductor integrated circuit evaluation system of the present invention. As essential blocks of the inspection system 26, the example of FIG. 2 shows a semiconductor integrated circuit evaluation system 20, a device model 23, a logic simulator 25 and a dump file 27 resulting from the logic simulation. The semiconductor integrated circuit evaluation system 20 of the present invention is formed with an engineering work station (EWS) 24 and an accelerator 22. As will be described in more detail later, the EWS 24 mainly is configured by a simulator, and the accelerator 22 is configured by a dedicated hardware for achieving a high speed processing. FIG. 2B is a schematic diagram showing an LSI tester having an equivalent function of the inspection system of FIG. 2A. The LSI tester 30 performs device testing on the actual LSI device by applying test patterns to the device, which is equivalent to the test conducted by the inspection system of FIG. 2A.

By the inspection system of FIG. 2A, it is possible to evaluate the test patterns for testing the LSI devices designed in the EDA environment as well as the performances of the LSI devices. The inspection system makes it possible to evaluate the semiconductor devices well before such semiconductor devices are actually fabricated on a silicon wafer. Further, the inspection system makes it possible to complete the test patterns for testing the LSI devices well before such LSI devices are actually put into production. In the example of FIG. 2A, the work station EWS 24 can receive the input data either from the logic simulator 25 or from the dump file 27.

In the case where the work station EWS 24 receives the input data from the logic simulator 25, the designed semiconductor device simulated by the device model 23 and the logic simulator is given to the EWS 24. The EWS 24 provides the test pattern to the simulated semiconductor device, and the resultant response signal of the device is evaluated by the accelerator 22. In the case where the work station EWS 24 receives the input data from the dump file 27, the data resulted from executing the device logic test simulation in the design stage of the semiconductor device is given to the EWS 24 from the dump file 27. The device output signals in the data from the dump file 27 is evaluated by the accelerator 22. Examples of the dump files of the device logic test simulator include Verilog of VCD (Value Change Dump) and STIL (Standard Test Interface Language) by IEEE.

Figure 3:
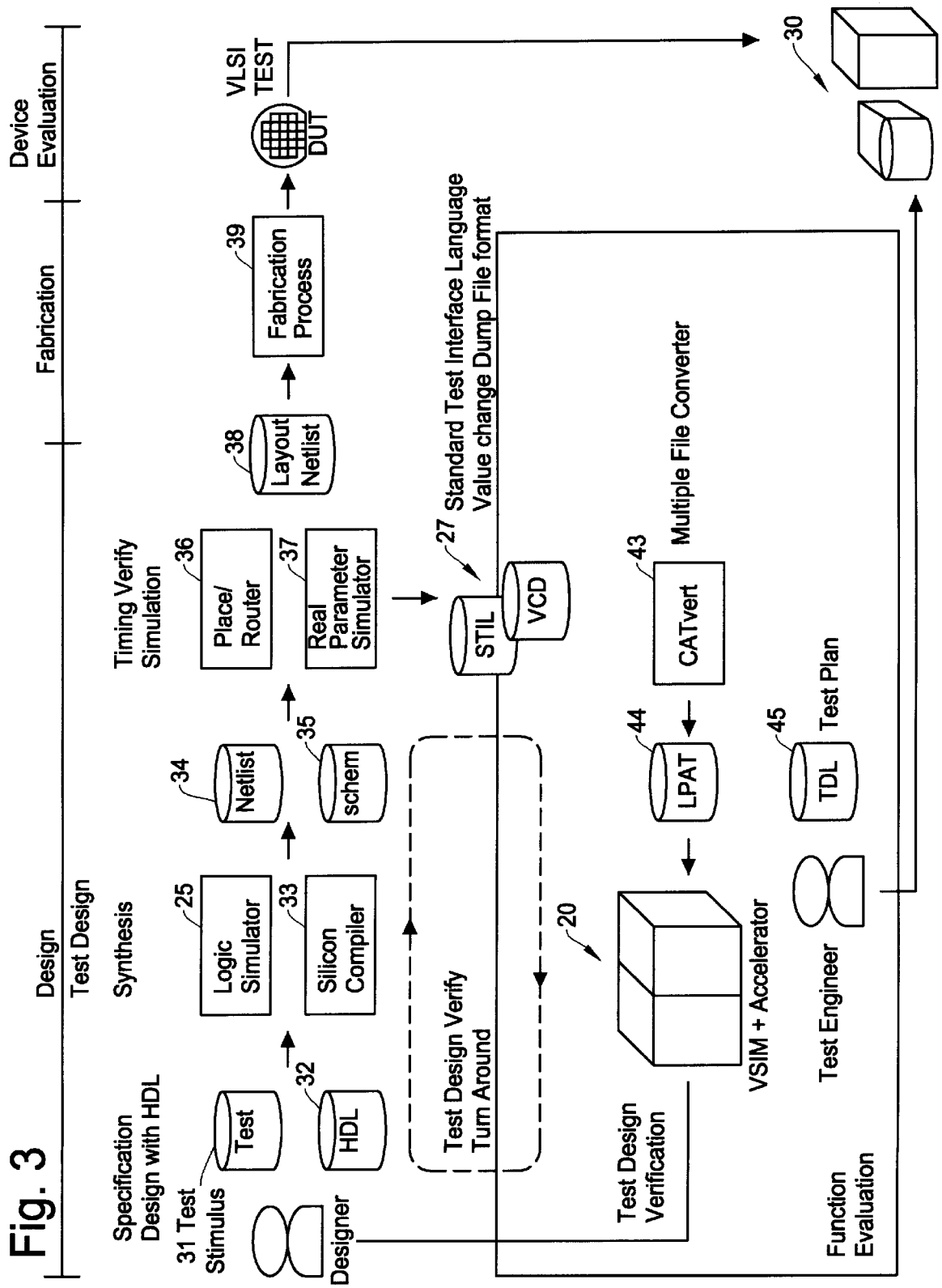
FIG. 3 is a schematic diagram showing an overall production process of semiconductor integrated circuits from a design stage, evaluation stage, and a production and test stage, and the relationship between the production stages and the semiconductor integrated circuit evaluation system of the present invention.

The relationship between the overall production process of semiconductor integrated circuits including design, evaluation, production test stages and the semiconductor integrated circuit evaluation system of the present invention is shown in the schematic diagram of FIG. 3. The process shown between the left end and about the center of FIG. 3 represents the CAD design stage of the semiconductor device and its simulated test stage. The process shown between about the center and the right end of FIG. 3 represents the device production stage and the test stage. The semiconductor integrated circuit evaluation system 20 of the present invention is directed to the device design stage in the process. The semiconductor integrated circuit evaluation system 20 performs the evaluation of the test patterns for testing the semiconductor device as well as the function of the designed semiconductor device using the evaluated test patters at high speed.

In the early part of the design stage, by conducting the CAD design, device design data 32 expressed by the hardware description language HDL and test signal data 31 for testing the designed device are produced. The data 31 and 32 described in the high level language is compiled to gate level logic data through processes of logic simulator 25 and silicon compiler 33. A net list 34 and circuit diagram data 35 showing the circuit connections among the gates are produced based on the compiled data created by the logic simulator and compiler.

Based on the net list 34 and the circuit diagram data 35, a layout simulation 36 for dealing with a physical layout and wiring process of the device on a silicon substrate and a parameter simulation 37 for assigning physical parameters of the device are implemented. As a consequence, data 38 showing layout net lists are derived from using these simulations. Through a process for fabricating integrated circuits on the silicon substrate based on the data 38, the designed semiconductor devices are produced. The actual semiconductor devices produced in this manner are evaluated by an LSI tester 30 with use of various test signals.

The semiconductor integrated circuit evaluation system of the present invention is advantageously applied to the above noted semiconductor production process in the loop designated by arrows in the drawing. The results of the simulations 36 and 37, which simulate the operational timings reflecting the physical layout and physical parameters of the device, are stored in, for example, a value change dump (VCD) file 27. The data in the dump file 27 is converted to test pattern data (LPAT) 44 through a conversion software 43. Such test pattern data is comprised of pattern data and timing data and produced in a manner to achieve test objectives expressed by a test description language TDL 45. The test pattern stored in the LPAT 44 is evaluated by the semiconductor integrated circuit evaluation system 20 of the present invention. Such an evaluation process is conducted by monitoring whether output patterns (expected values) of the test signal responsive to input patterns of the test signals match the output signals of the subject semiconductor device.

Figure 4:
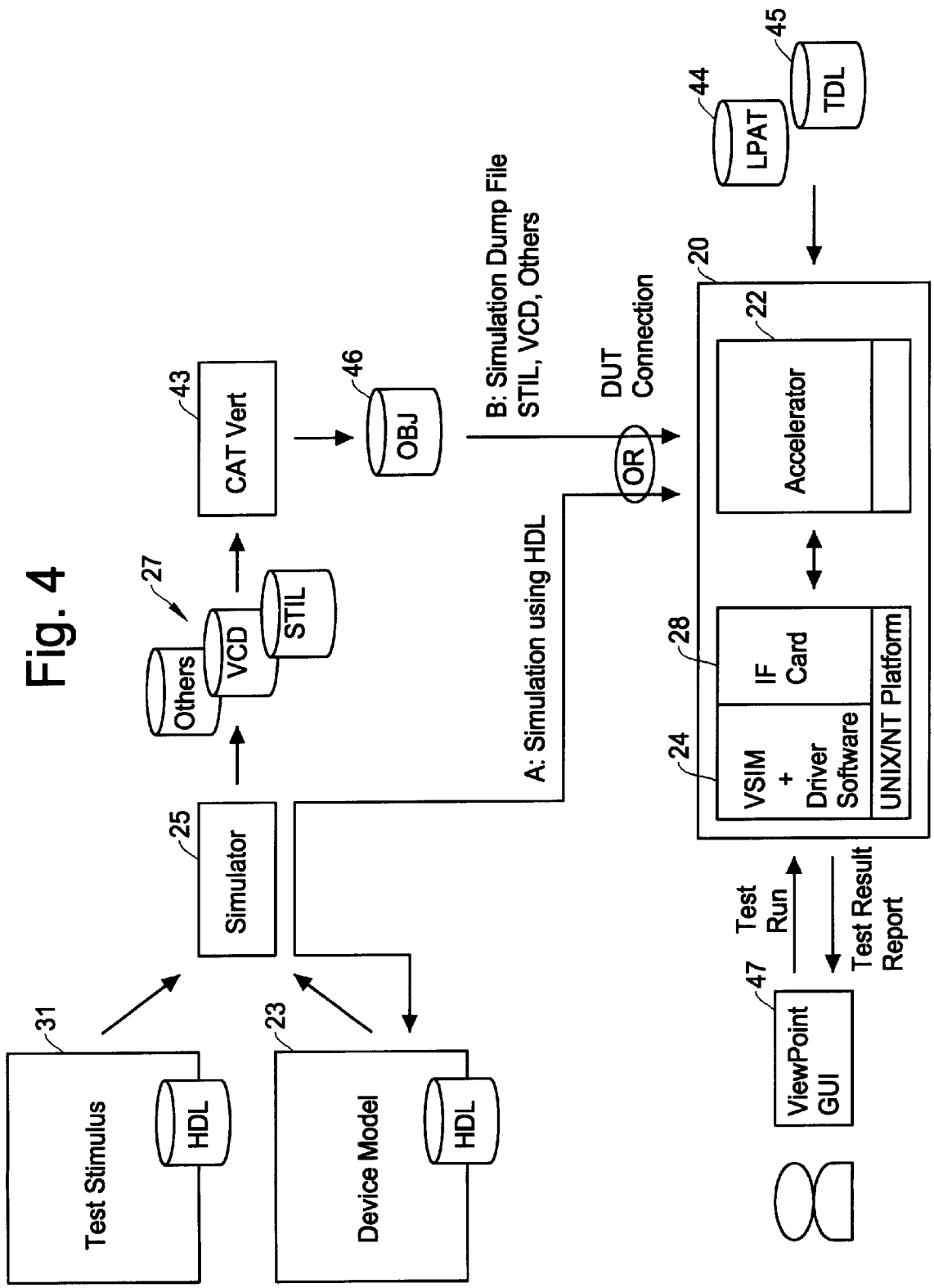
FIG. 4 is a block diagram showing a more detailed structure of the semiconductor integrated circuit evaluation system of the present invention and the relationship between the structure of the evaluation system and the software and data involved in the semiconductor integrated circuit design process.

FIG. 4 is a block diagram showing a structure of the semiconductor integrated circuit evaluation system of the present invention and the relationship between the evaluation system and the software and data directly involved in the evaluation system. In FIG. 4, the parts identical to that of FIG. 3 are designated by the same reference numerals. However, a logic simulator 25 in FIG. 4 corresponds to an overall concept of the logic simulator 25, compiler 33, simulators 36 and 37 of FIG. 3. The data from the dump file 27 is provided to the semiconductor integrated circuit evaluation system 20 through the file 46. Alternatively, the data from the logic simulator 25 is provided to the semiconductor integrated circuit evaluation system 20. The semiconductor integrated circuit evaluation system 20 is also provided with the test patterns from the LPAT 44 and TDL 45.

The user instructs the evaluation system 20 through an operating system such as a graphic user interface GUI 47. The semiconductor integrated circuit evaluation system 20 is composed of an EWS (engineering work station) 24, an accelerator 22 and an interface card 28. The EWS 24 and the accelerator 22 function as a tester emulator. The EWS 24 also includes a driver software of the accelerator 22 to control the accelerator 22 through the interface card 28. The details of the structure and operation of the accelerator 22 will be given later.

Figure 5:
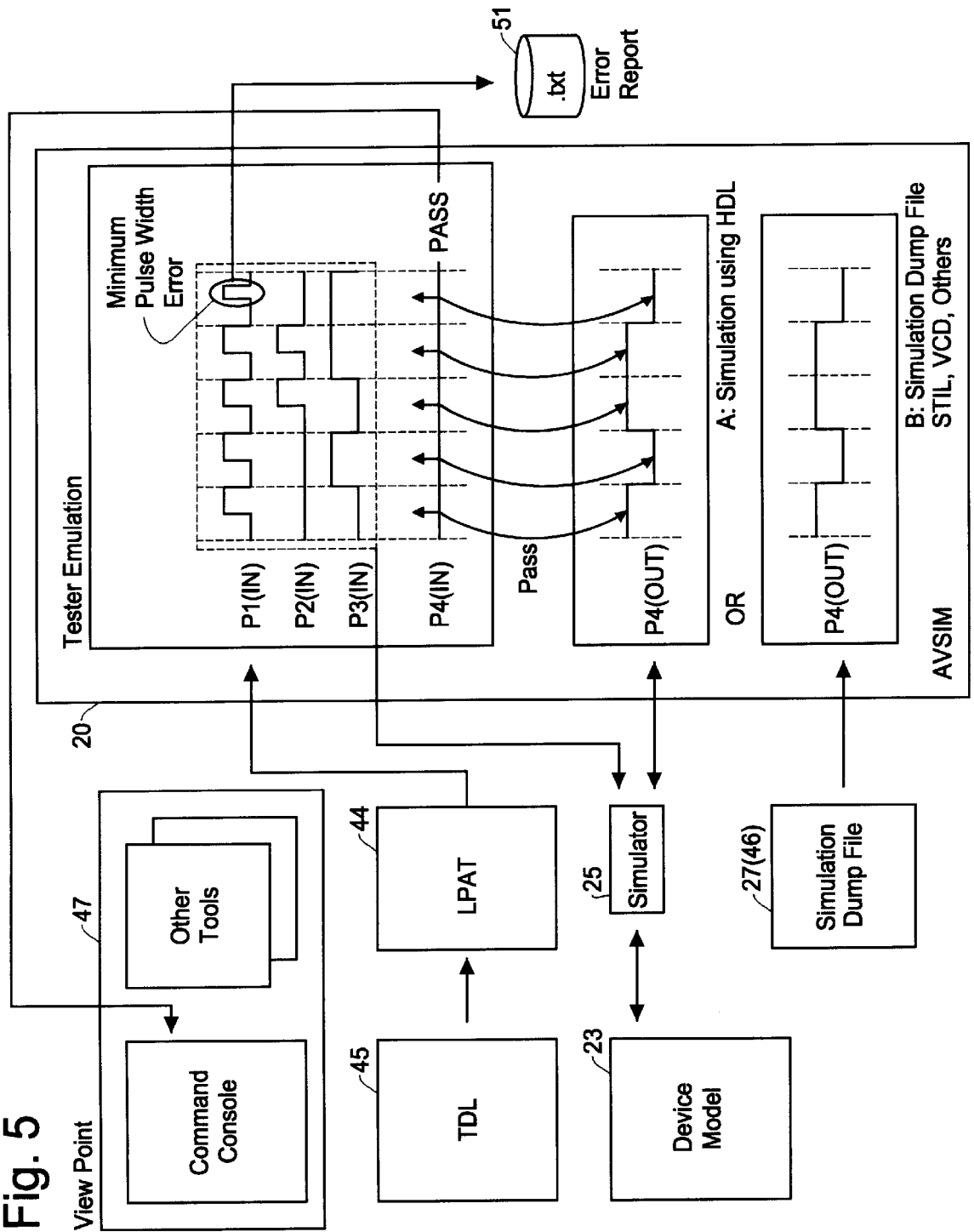
FIG. 5 is a waveform diagram showing an operation of the semiconductor integrated circuit evaluation system of the present invention.

An example of operation of the semiconductor integrated circuit evaluation system of the present invention is shown in the waveform diagram of FIG. 5. The user initiates a test start command on the GUI 47 screen, thereby the test patterns from the TDL 45 and LPAT 44 are provided to the evaluation system. The tester emulator is activated. The example of FIG. 5 shows the situation where an output of a semiconductor device pin 4 at the timings of strobe signals (designated by arrows) are in high or low levels shown therein when test waveforms illustrated are applied to semiconductor device pins 1–3.

The test waveforms such as shown in the drawing are given to the device model 23 through the logic simulator 25 and the resultant output at pin 4 of the device model is compared with the output at pin 4 of the tester emulator. Alternatively, output data of pin 4 in the dump file 27 is compared with the output of pin 4 of the tester emulator. This arrangement makes it possible to evaluate the operations of the designed semiconductor device and the test patterns to test the semiconductor device. If the comparison results indicate that the both data match with one another, it means that the test patterns are appropriate. If the data is different from the other, it means that the test patterns are inappropriate or there is an error in the operation of the semiconductor device. Further, in the case where the test waveform has a pulse width which is smaller than the predetermined minimum pulse width such as shown in the waveform of pin 1, the system detects an error in the test pattern. Such error information is stored in a file 51.

Figure 6:
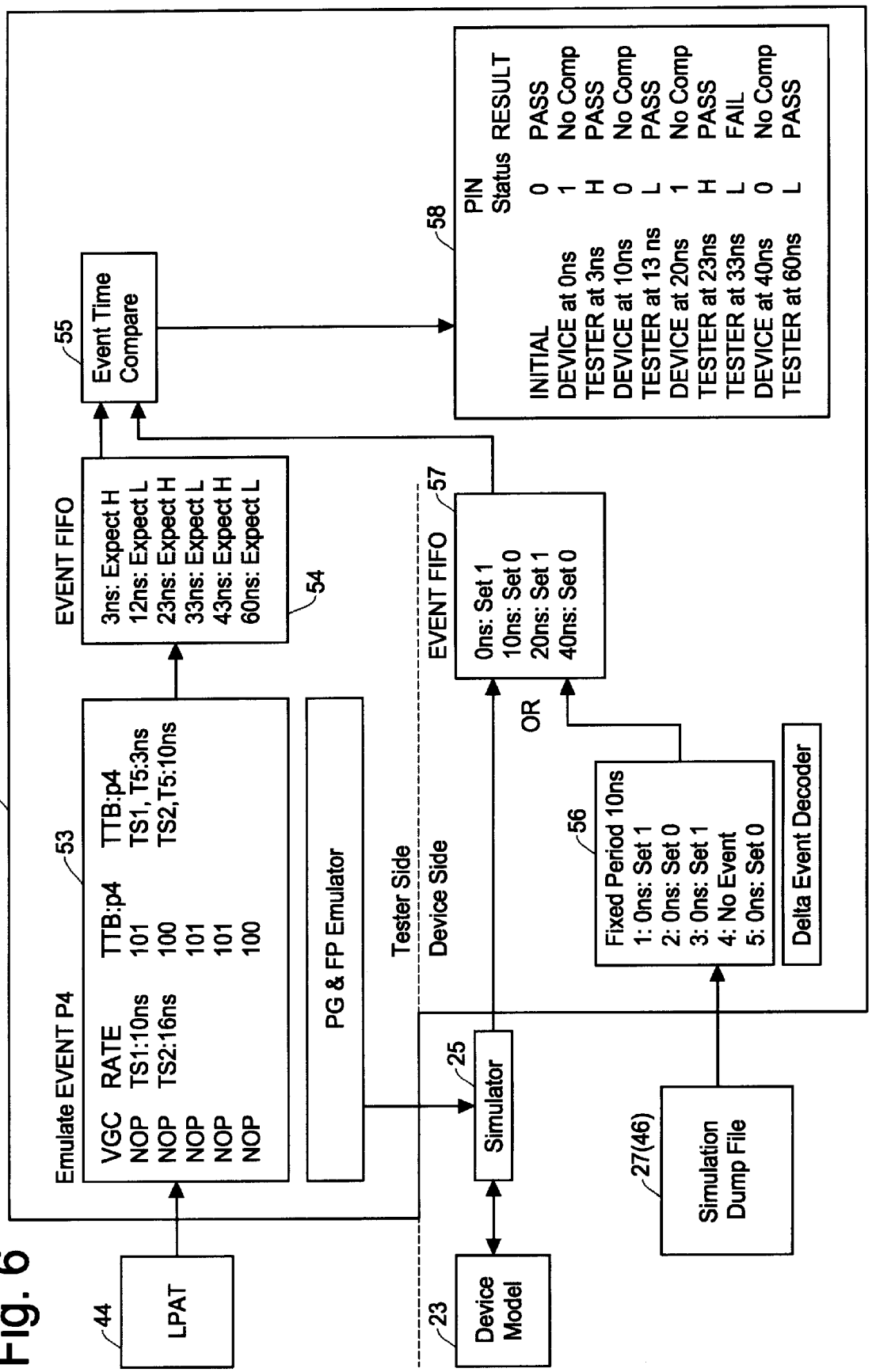
FIG. 6 is a schematic diagram showing an operation of the semiconductor integrated circuit evaluation system of the present invention with reference to logic data.

An example of operation of the semiconductor integrated circuit evaluation system of the present invention is further explained with reference to FIG. 6. The test pattern data from the LPAT 44 is classified into event based commands and data by a tester emulator 53. In FIG. 6, a reference "VGC" designates a vector generator controller and indicates "NOP" in this example. A reference "RATE" designates a rate generator which defines each tester rate based on a time interval between adjacent test pulses. A reference "TTB" designates a truth table buffer which expresses the test pattern by "1" and "0". A reference "FP" designates a frame processor which defines each test signal timing in the tester rate based on a delay time. Similar to the example of FIG. 5, an example of FIG. 6 shows the data at the output pin 4 of the semiconductor device.

The data from the tester emulator 53 is provided to an event FIFO (first-in-first-out) 54. The data from the logic simulator 25 or the dump file 27 is provided to the evaluation system 20 as the device input data. The data from the logic simulator 25 is directly supplied to an event FIFO 57 while the data from the dump file 27 is supplied to the event FIFO 57 via an event decoder 56. The tester emulator 53 (emulator 62 in FIG. 7), the event FIFO 54 and 57, and an event format emulator 63 (FIG. 7) are structured by hardware in the accelerator 22. The output data from each of the FIFO 54 and 57 is compared with one another by a comparator 55. This operation is conducted by comparing the event data that came earlier with the other event data. The result of the comparison is stored in a file 58.

Figure 7:
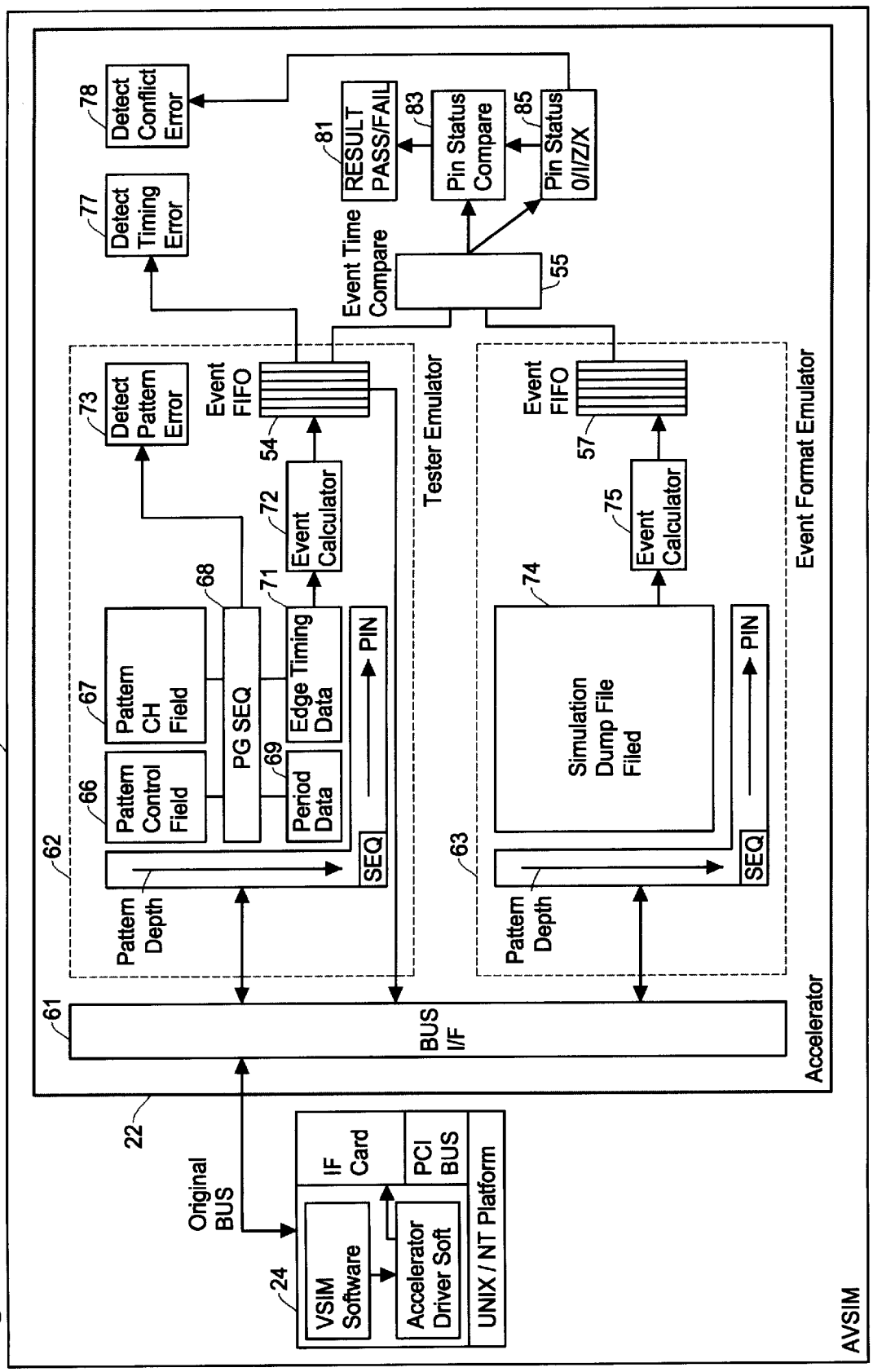
FIG. 7 is a block diagram showing a more detailed structure of the semiconductor integrated circuit evaluation system of the present invention.

An example of detailed structure of the accelerator 22 in the semiconductor integrated circuit evaluation system 20 of the present invention is shown in the block diagram of FIG. 7. The test pattern data from the EWS 24 and the data from the logic simulator 25 or dump file 27 are provided to a tester simulator 62 and an event format emulator 63, respectively, through a bus 61. The tester emulator 62 has fields formed in both directions of the pin number and the pattern depth, thereby forming the data described with reference to FIG. 6 in the data fields 66, 67, 69 and 71, which are generated through a pattern sequencer 68. Such event data is supplied to the FIFO 54 through an event calculator 72.

Similarly, in the event format emulator 63, event data is formed in a dump file field 74 in the directions of the pattern depth and the pin number. The event data is supplied to the FIFO 57 through an event calculator 75. The events derived from the FIFO 54 and FIFO 57 are compared with one another by the comparator 55 with respect to a predetermined time reference. The comparison result may be further applied to pin statuses 83 and 85, thereby producing a comparison result 81 of pass/fail. Pattern errors 73 and timing errors 77 are directly detected without comparing the output data from the FIFO 54 and FIFO 57.

The operation of taking the event data from the FIFO 54 and the FIFO 57 and comparison between the data by the comparator 55 is described in detail with reference to FIGS. 6, 7 and 8. As noted above, the event FIFO 54 stores the emulated information which is a test signal that is to be generated by the tester as a device pin signal (in this example, output pin 4). As shown in FIG. 6, the contents of the information include timings (such as 3 ns, 13 ns) and types of event (expected value, High or Low). The event FIFO 57 also stores the similar information which is received from the dump file (dump file 46) storing the simulated data or from the logic simulator 25.

Figure 8A:
FIG. 8 is a waveform diagram showing an image of signal waveforms corresponding to event data stored in an event FIFO in the semiconductor integrated circuit evaluation system of the present invention.
Figure 8B:
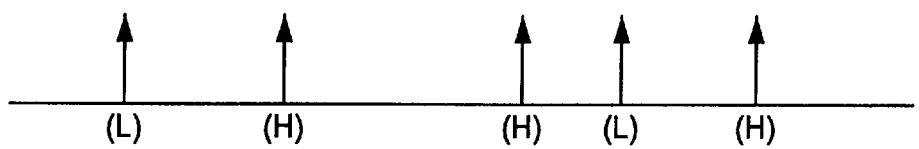

Therefore, the event FIFO 54 and FIFO 57 store the information on the common pins of the semiconductor device. The event FIFO 54 stores the information regarding the test patterns and the event FIFO 57 stores the information regarding the input and output waveforms of the semiconductor device. FIG. 8 shows an image of signal waveforms corresponding to the event information stored in the event FIFOs 54 and 57. FIG. 8A shows the device information and FIG. 8B shows the test pattern information.

The event comparator 55 in FIG. 6 receives the event information from the outputs of the event FIFOs 54 and 57, respectively. Such event information respectively show "3 ns: expect H" and "10 ns: set 1". By observing the timing relationship between the event information, and the event information "0 ns: set 1" is extracted from the FIFO 57 since it shows a timing earlier than the other. Consequently, the next event information showing "10 ns: set 0" appears at the output of the FIFO 57. At this moment, since the event information at the output of the event FIFO 54 is not extracted therefrom, the information "3 ns: expect H" remains at the output of the FIFO 54. Since the event information "0 ns: set 1" taken out is to set the device pin, status data in the file 58 is set to "1". This event information indicates a set event, no comparison is made by the comparator and thus the status result in the file 58 is marked "pass".

Next, the timing relationship between the information "3 ns: expect H" and "10 ns: set 1" given to the comparator 55 is studied and the former information is extracted from the event FIFO 54 because it shows the timing preceding to the latter. Since this information shows a comparison event, the pin status data "1" set in the previous cycle is compared with the expected value H in this event information. The comparison result shows a match, a result "pass" is recorded in the status result in the file 58. As in the foregoing, when the device event information showing a set event, the value in the event information is stored in the file 58 without performing the comparison. Then, if there is a comparison event received from the tester emulator immediately after the set event, the value in the set event is compared with the expected data in the comparison event. By comparing the event information at the outputs of the event FIFO 54 and FIFO 57 in the above noted sequence, it is possible to achieve the test pattern evaluation and the device performance evaluation.

An LSI tester must incorporate test channels corresponding to the maximum number of pins of the device to be tested, which ranges as many as 124–1,024. Each test channel includes a test pattern generator and operates at the same time with other test channels. It is unreasonable, in terms of cost, to incorporate signal processing circuits corresponding to all of the test channels of the LSI tester in the semiconductor integrated circuit evaluation system of the present invention. Thus, in the preferred embodiment of the semiconductor integrated circuit evaluation system of FIG. 7, it is used therein a signal processing circuit for dealing with several pins or several ten pins and a memory corresponding to such a signal processing circuit which is substantially smaller in the capacity than the pattern depth of the test pattern. In this arrangement, the test pattern evaluation and the device performance evaluation are conducted a plurality of times by dividing the number of pins and the pattern length into a predetermined small size to prevent the cost increase, achieving a good balance between the test cost and test performance.

As described in the foregoing, according to the semiconductor integrated circuit evaluation system of the present invention, the test pattern for testing the LSI device produced based on the CAD data in the design stage is evaluated at high speed. By using the evaluation system of the present invention, the test pattern is ready when the LSI devices are put into production. Thus, it is possible to put the LSI devices quickly into the market. Further, according to the evaluation system of the present invention, it is possible to examine test pattern with a small sized dedicated hardware, at high speed, without using an actual LSI tester.

What is claimed is:

1. A semiconductor integrated circuit evaluation system, comprising:

a test pattern file for storing a test pattern composed of an input pattern to be applied to a device for testing the device under test and an expected value pattern to compare with an output signal of the device under test responsive to the input pattern;

a first memory for storing tester event information by receiving a predetermined amount of test pattern from the test pattern file;

a first FIFO (first-in-first-out) for receiving a predetermined amount of the tester event information from the first memory and extracting the tester event information in the order of receiving the same;

a second memory for storing device event information by receiving a predetermined amount of event information resulted from logic simulation of the device under test based on design data of the device produced through a computer aided design process;

a second FIFO (first-in-first-out) for receiving a predetermined amount of the device event information from the second memory and extracting the device event information in the order of receiving the same;

a comparator for comparing the event information from the first FIFO and the second FIFO; and means for generating a comparison result from the comparator.

2. A semiconductor integrated circuit evaluation system as defined in claim 1, wherein the first FIFO and second FIFO, the comparator, and the means for generating the comparison result are configured by hardware.

3. A semiconductor integrated circuit evaluation system as defined in claim 1, wherein the test pattern is accessed through a work station, and the test pattern is transferred to the first memory under the control of the work station.

4. A semiconductor integrated circuit evaluation system as defined in claim 1, wherein the first FIFO, the second FIFO, the comparator and the means for generating the comparison result are configured by hardware to form a hardware accelerator, and evaluation of the test patterns and a simulated test on the device under test are conducted by an interaction between the hardware accelerator and the work station.

5. A semiconductor integrated circuit evaluation system as defined in claim 1, further comprising a first event calculator provided between the first memory and the first FIFO and a second event calculator provided between the second memory and the second FIFO.

6. A semiconductor integrated circuit evaluation system as defined in claim 1, further comprising a data file for storing data which shows an earlier timing of events between data at an output of the first FIFO and at an output of the second FIFO.

7. A semiconductor integrated circuit evaluation system as defined in claim 1, wherein data showing an earlier timing of events between data at an output of the first FIFO and at an output of the second FIFO is stored in a data file, and when the data stored in the data file is device event data, the device event is compared with an expected value in a comparison event in a tester event data coming immediately after the device event data to determine whether the comparison result shows a match between the two to evaluate the test pattern.

8. A semiconductor integrated circuit evaluation system as defined in claim 1, wherein the test pattern stored in the test pattern file is produced based on data from a dump file which stores data resulted from carrying out a logic simulation of an operation of a semiconductor device where the logic simulation is performed based on design data created in a computer aided design process of the semiconductor device.

9. A semiconductor integrated circuit evaluation system as defined in claim 1, wherein the first FIFO, the second FIFO, the comparator and the means for generating the comparison result are configured by hardware to form a hardware accelerator, and the evaluation system further includes a work station which emulates functions of an LSI tester by using the test pattern from the test pattern file, and evaluation of the test patterns and a simulated test on the device under test are conducted by an interaction between the hardware accelerator and the work station.

* * * * *